(12) United States Patent
Muralimanohar et al.

(10) Patent No.: US 10,754,581 B2
(45) Date of Patent: Aug. 25, 2020

(54) IDENTIFYING OUTLYING VALUES IN MATRICES

(71) Applicant: Hewlett Packard Enterprise Development LP, Houston, TX (US)

(72) Inventors: Naveen Muralimanohar, Palo Alto, CA (US); Ali Shafiee Ardestani, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 56 days.

(21) Appl. No.: 16/073,143

(22) PCT Filed: Mar. 31, 2016

(86) PCT No.: PCT/US2016/025136
§ 371 (c)(1),
(2) Date: Jul. 26, 2018

(87) PCT Pub. No.: WO2017/171766
PCT Pub. Date: Oct. 5, 2017

(65) Prior Publication Data
US 2019/0065117 A1 Feb. 28, 2019

(51) Int. Cl.
*G06F 16/22* (2019.01)
*G06F 3/06* (2006.01)
(Continued)

(52) U.S. Cl.
CPC .......... *G06F 3/0659* (2013.01); *G06F 3/0604* (2013.01); *G06F 3/0683* (2013.01); *G06F 16/2237* (2019.01); *G06F 16/2379* (2019.01); *G06J 1/00* (2013.01); *G06T 1/60* (2013.01); *G11C 13/0002* (2013.01); *G11C 11/56* (2013.01); *G11C 11/5685* (2013.01)

(58) Field of Classification Search
CPC ............... G06F 3/0659; G06F 16/2237; G06F 16/2379; G06F 3/0604; G06F 3/0683; G06T 1/60; G06J 1/00; G11C 13/0002; G11C 11/5685; G11C 11/56
See application file for complete search history.

(56) References Cited

U.S. PATENT DOCUMENTS 6,920,450 B2  7/2005  Aono et al.
8,407,560 B2  3/2013  Ordentlich et al.
(Continued)

FOREIGN PATENT DOCUMENTS

CN  101546598 A  9/2009
CN  104637536 A  5/2015

OTHER PUBLICATIONS

International Search Report & Written Opinion received in PCT Application No. PCT/US2016/025136, dated Dec. 16, 2016, 9 pages.
(Continued)

*Primary Examiner* — Tasnima Matin

(57) ABSTRACT

In an example, a method comprises receiving a first matrix of values to be mapped to a resistive memory array, wherein each value in the matrix is to be represented as a resistance of a resistive memory element. An outlying value may be identified in the first matrix. At least one value of a portion of the first matrix containing the outlying value may be substituted with at least one substitute value to form a substituted first matrix.

15 Claims, 9 Drawing Sheets

(51) Int. Cl.
  *G11C 13/00* (2006.01)
  *G06T 1/60* (2006.01)
  *G06J 1/00* (2006.01)
  *G06F 16/23* (2019.01)
  *G11C 11/56* (2006.01)

(56) References Cited

U.S. PATENT DOCUMENTS

| | | | |
|---|---|---|---|
| 9,152,827 B2* | 10/2015 | Linderman | G06G 7/16 |
| 2005/0237834 A1 | 10/2005 | Bozano et al. | |
| 2010/0020242 A1 | 1/2010 | Lammers et al. | |
| 2011/0310437 A1* | 12/2011 | Guo | H04N 1/4052 |
| | | | 358/3.04 |
| 2013/0028004 A1 | 1/2013 | Snider | |
| 2014/0133211 A1 | 5/2014 | Nazarian et al. | |
| 2014/0172937 A1 | 6/2014 | Linderman et al. | |
| 2014/0361851 A1 | 12/2014 | Keane et al. | |
| 2015/0171868 A1 | 6/2015 | Rodriguez et al. | |

OTHER PUBLICATIONS

Miao Hu et al: "Dot-product engine for neuromorphic computing : programming 1T1M crossbar to accelerate matrix-vector multi plication", Mar. 3, 2016. XP055450494. Retrieved from the Internet: URL:https://www.labs.hpe.comjtechreports/2016/HPE-2016-23. pdf [retrieved on Feb. 12, 2018]—7 pages.

Velasquez A et al., "Memristor-Based Crossbar Computing", University of Central Florida, < http://eecs.ucf.edu/~velasquez/C41. pdf > (Research Paper), 2014, 1 page.

Extended European Search Report received for EP Patent Application No. 16897315.4, dated Feb. 22, 2018, 9 pages.

* cited by examiner $$A = \begin{matrix} -1 & -1 & -1 \\ -1 & 8 & -1 \\ -1 & -1 & -1 \end{matrix} \qquad (a)$$

$$A' = \begin{matrix} -1 & -1 & -1 \\ -1 & -1 & -1 \\ -1 & -1 & -1 \end{matrix} \qquad (b)$$

Fig. 3

$$A = \begin{matrix} -1 & -1 & -1 \\ -1 & 8 & -1 \\ -1 & -1 & -1 \end{matrix}$$

(a)

$$A'' = \begin{matrix} -1 & -1 & 0 & 0 & -1 \\ -1 & 3 & 3 & 2 & -1 \\ -1 & -1 & 0 & 0 & -1 \end{matrix}$$

(b)

$$A''' = \begin{matrix} -1 & -1 & 0 & 0 & 0 & 0 & 0 & 0 & 0 & -1 \\ -1 & 1 & 1 & 1 & 1 & 1 & 1 & 1 & 1 & -1 \\ -1 & -1 & 0 & 0 & 0 & 0 & 0 & 0 & 0 & -1 \end{matrix}$$

$$A = \begin{matrix} 1 & 4 & 8 \\ 1 & 4 & 4 \\ 8 & 1 & 8 \end{matrix} \quad \text{(a)}$$

$$A1 = \begin{matrix} 0 & 0 & 8 \\ 0 & 0 & 0 \\ 8 & 0 & 8 \end{matrix} \quad A' = \begin{matrix} 1 & 4 & 0 \\ 1 & 4 & 4 \\ 0 & 1 & 0 \end{matrix} \quad \text{(b)}$$

$$A2 = \begin{matrix} 0 & 4 & 0 \\ 0 & 4 & 4 \\ 0 & 0 & 0 \end{matrix} \quad A'' = \begin{matrix} 1 & 0 & 0 \\ 1 & 0 & 0 \\ 0 & 1 & 0 \end{matrix} \quad \text{(c)}$$

Fig. 9

IDENTIFYING OUTLYING VALUES IN MATRICES

BACKGROUND

Resistive memory devices, such as "memristors", have been described in which an electrical component is capable of being written with a resistance in a non-volatile manner. Use of arrays of such devices has been proposed for carrying out logical operations.

BRIEF DESCRIPTION OF DRAWINGS

Non-limiting examples will now be described with reference to the accompanying drawings, in which:

FIGS. 3a and 3b show examples of a matrix and a substituted matrix respectively;

FIGS. 6a, 6b and 6c show further examples of matrices;

FIG. 9 shows further examples of matrices;

DETAILED DESCRIPTION

Figure 1:
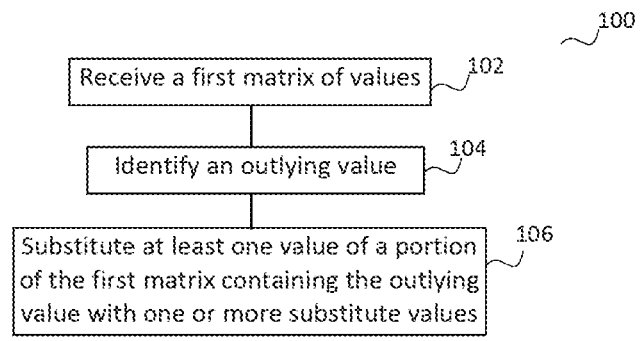
FIG. 1 is a flow chart showing an example method.

FIG. 1 shows an example of a method 100, which may be a method of substituting values in a matrix to be mapped to a resistive memory of and which may be a computer implemented method. The method 100 comprises receiving a first matrix of values to be mapped to a resistive memory array, wherein each value in the matrix is to be represented as a resistance of a resistive memory element (block 102), identifying an outlying value in the first matrix (block 104), and substituting at least one value of a portion of the first matrix containing the outlying value with at least one substitute value to form a substituted first matrix (block 106).

In some examples, the first matrix represents a kernel to be used for data processing. In an example, the first matrix may represent a kernel for image processing, for example, the first matrix may represent an image sharpening kernel which is to be convolved with at least a portion of an image. In other examples, the first matrix may represent a kernel for operating on at least a portion of an image on which object or text recognition is to be performed, or audio data on which speech recognition is to be performed. In other examples, the matrix may represent a kernel for operating on the results of a scientific experiment from which conclusions or other information is to be extracted, or may represent any other form of operand for any form of processing.

Figure 2:
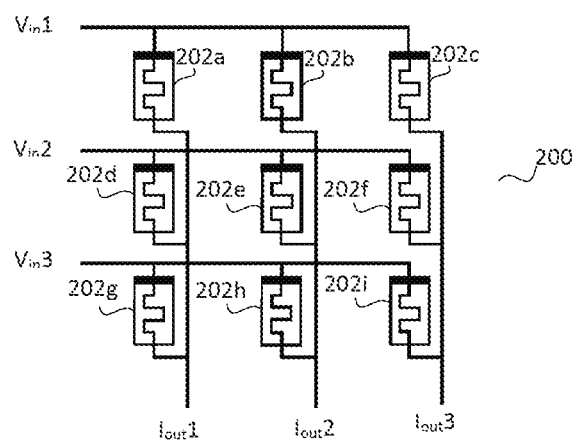
FIG. 2 is a simplified schematic of an example resistive memory array apparatus.

In an example, a resistive memory array comprises a two-dimensional grid of resistive memory elements, which may be a crossbar array. An example of a crossbar resistive memory array 200 of resistive memory elements 202 (for example, memristors or other resistive memory elements) is shown in FIG. 2. This resistive memory array 200 comprises at least one input row, or 'word line', to receive input data and at least one column, or 'bit line', to output a value. Each resistive memory element 202 may have a bit depth, which may be common to the elements 202 of the array 200. In this example, the term 'bit depth' is the number of bits that can be represented by a single resistive memory element 202.

In some examples, the elements 202 may be binary elements having one of two values for example, representing 0 or 1 (a bit depth of one bit), however resistive memory elements which can take a plurality of values, for example 16 distinct levels (a bit depth of four bits) have been demonstrated. A matrix can be mapped or 'programmed' onto the array 200 by applying voltage pulses to each of the elements 202, each voltage pulse incrementally changing the resistance of that element 202. The resistance level is then 'remembered' by the elements 202 as a resistance level, even after a power supply is removed.

Once a matrix is mapped to the array 200 (i.e. an array is written with a representation of the array), the array 200 can be used in matrix operations. For example if an input voltage vector is passed through the array 200, the input voltage vector is effectively weighted by the conductance at each element 202 of the array 200 and thus the output voltage is effectively a dot product of the input voltage vector and the mapped array of resistance values (i.e. the input matrix and the mapped matrix). Such an input voltage vector may be obtained from analogue data supplied for processing using a resistive memory array 200. The data may for example represent at least one pixel of an image, or a word (or sub-word or phrase) of speech, or results of a scientific experiment, or any other data. The input data may be provided as a vector, i.e. a one dimensional data string, and applied to the array as a voltage value (generally a voltage lower than that used to set the resistance of an array element 202, such that the resistance of the element 202 is not changed in this operation).

In some examples, the array 200 may comprise part of a dot product engine for use in multiplying matrices together. Such dot product engines have been proposed for use in deep learning apparatus and to perform complex computational operations.

In examples herein, such an array 200 may be written with a representation of a substituted matrix, for example a substituted first matrix resulting from the method of FIG. 1, in which at least one outlying value has been substituted.

When mapping a matrix to a resistive memory array, the highest (h) and lowest (l) numerical values in the matrix may be mapped to the highest and lowest resistances of the resistive memory elements (for example using an offset, as set out below). The values of the other elements may then mapped proportionally, according to their ratios with h and l. Therefore, in order to map a matrix to a single resistive memory array, the range of the values (i.e. h-l) should be less than or equal to the range of resistive values of the elements in the resistive memory array. In some examples, the mapping of the numerical values may also account for array parasitic currents, data patterns and the location of a cell in an array. It may be appreciated that the examples given herein are simplified examples and that in some examples, the mapping may be more complicated, for example, a scaling factor may be applied, or the mapping may be non-linear.

To consider an example of mapping using an offset in greater detail, in a simple example, every element in a matrix is "99" (1100011 in binary) except one value of "110" (1101110 in binary). During the mapping process, an offset may be applied. In this particular example, 99 may be represented as, for example "1" and 110 as "12", i.e. a negative offset of 98 is applied in the mapping.

When multiplying an input matrix (for the purpose of example, the vector [5; 10]) with a row matrix (again, for the purpose of example, [99 110]), the calculation to be performed with reference to the original matrix is:

5*99+10*110

In practical terms, using an array mapped as set out using an offset above, computation carried out by an array is:

5*1+10*12

An offset term may be added to this result to compensate of the offset applied to the original matrix in the mapping. In this example, this is based on the offset term applied in the mapping, scaled by the sum of the input matrix elements (in this example, the vector elements 5 and 10, to give in this example an offset term to be applied to the output of (5+10)*98. In this example, it may be verified that:

5*99+10*110=5*1+10*12+(5+10)*98.

The offset term is common for all column calculations. In other words, if there is another row in the original matrix of, in this example matrix, [99 99], represented in an array as [1, 1], then the scaling term is the same, and the computation of this for this row would be:

5*1+10*1+(5±10)*98.

Considering now the example matrices in FIG. 3, in order to map the matrix A in FIG. 3a to a resistive memory array, each element should be capable of handling ten different levels (i.e. −1, 0, 1 . . . 8). A bit depth of 3 would imply that the elements each support $2^3=8$ different levels, but this particular matrix calls for ten levels, suggesting in turn a minimum bit depth of 4. In other words, each element should provide 4 bits worth of storage such that the lowest resistance level may be mapped to "−1" and the highest may be mapped to "8".

In this example, it may be noted that, except for the outlying value "8", the entire matrix can be mapped to an array with a bit depth of 1 as the matrix now comprises a single value, "−1". The inclusion of the outlying value means more levels should be representable, which may place more pressure on the write circuit, accuracy, write energy and write cycles and may reduce the efficiency of the resistive memory array.

This overhead can be reduced using the method 100, as by substituting or 'pruning' outlying values, (such as the highest and/or lowest values in the matrix), the range of the numbers in the matrix can be reduced, which can mean that the values may be represented with a smaller range of resistances, i.e. the elements may have a smaller bit depth. An example substituted matrix A' is shown in FIG. 3b. A' is similar to A except that the outlying value "8" has been replaced with a value which is closer to the other values, in this example, with the value of "−1". Indeed, in this example, "−1" is the value that most significantly reduces the range of the values in the matrix A'.

According to some examples, identifying an outlying value in block 104 comprises identifying the values that deviate most significantly from a representative 'average' of the values, for example, the mean, median or modal value of the matrix. In other examples, it may comprise scanning the matrix elements for the highest and/or lowest values of the matrix and identifying at least one of the highest and/or lowest elements of the matrix as an outlying value.

In some examples, identifying an outlying value comprises calculating a bit depth to represent the range of values in the first matrix and then, taking each value in turn, determining that that particular value is an outlying value if the bit depth to represent the range of the values is greater than the number of bits to represent the range of the other values in the matrix.

In some examples, identifying an outlying value comprises calculating a bit depth to represent the statistical range of the values in the first matrix and determining a value is an outlying value if the bit depth to represent the range of the values is reduced if the value is removed.

Figure 4:
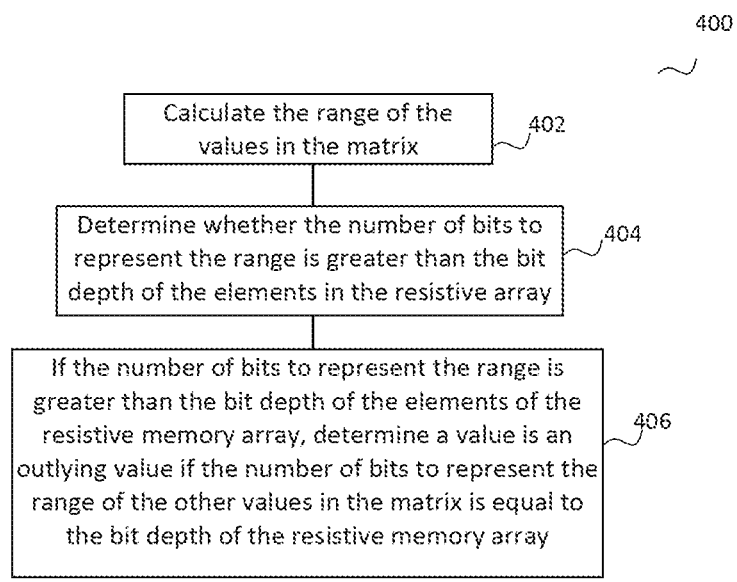
FIG. 4 is a flow chart showing an example method of identifying an outlying value.

FIG. 4 shows a further example of how to identify outlying values in order to reduce the range of the values in the matrix, in this example so that the matrix can be mapped to a resistive memory array of fixed bit depth. The method comprises calculating the range of the values in the matrix (block 402) and determining whether the number of bits to represent the range is greater than the bit depth of the elements in the resistive memory array (block 404). If the number of bits to represent the range is greater than the bit depth of the elements of the resistive memory array, then it may be determined to reduce the bit depth (i.e. the value range) of the matrix so that the matrix can be mapped to the resistive memory array. Thus, in this example, in block 406, the method comprises determining a value is an outlying value if the number of bits to represent the range of the other values in the matrix (i.e. other than the value in question) is equal to the bit depth of the resistive memory array.

As will be apparent, the examples given above may readily be generalised to identify two or more outlying values.

Once an outlying value has been identified, the method may move on to substituting at least one value of a portion of the first matrix containing the outlying value with at least one substitute value to form a substituted first matrix (for example, as described in block 106).

In one example, the block of substituting comprises substituting the outlying value for a substitute value, as was shown above in FIGS. 3a and 3b.

In that case, "−1" may be chosen as it is the value that most significantly reduces the range of the values in the matrix A'. Therefore in some examples, substitute values may be chosen so as to reduce the range of the values in the substituted first matrix when compared to the (unsubstituted) first matrix. This may comprise choosing substitute values that lie at or near a representative "average value" such as the mean, median or modal value of the first matrix.

In some examples, an appropriate non-outlying value to substitute may be chosen using the inverse of the criteria for selecting an outlying value (described above). For example, an appropriate substitute value may be one that, when substituted, does not increase the range of the values in the substituted first matrix, compared the range of the other values of the matrix. In another example, an appropriate substitute value may be one where the bit depth to represent the range of the values in the substituted first matrix is the same if the substitute value is present, or removed from the matrix.

Figure 5:
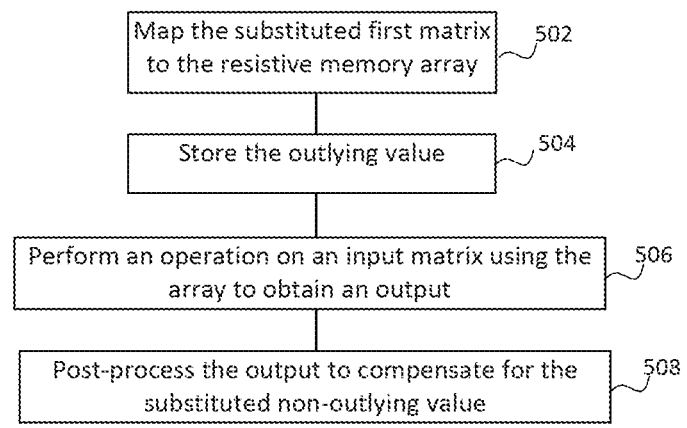
FIG. 5 is a flow chart of an example method of performing a matrix operation.

Once the substituted first matrix has been obtained, and as shown in FIG. 5, the method may comprise mapping the substituted first matrix to the resistive memory array (block 502). The value and location of the outlying values in the first matrix (in this example, A[1][1]=8) may be stored (block 504), for example, in a buffer or any other storage medium. The resistive memory array can then be used to perform matrix operations (block 506), for example a matrix V=[2, 3, 4] (in this example, a one dimensional matrix, or vector) can be multiplied with the substituted matrix by passing a voltage vector corresponding to V through the resistive memory array having the matrix mapped thereto. Once the matrix operation using the resistive element array has been performed, the CPU can use the stored outlier information to post-process the output to compensate for the substituted non-outlying value (block 508). This corrects the output to take into account the fact that the outlying value A[1][1] was substituted.

In matrix multiplication, it has been found that the overhead of post-processing in this way increases linearly with the number of outliers. Therefore, in scenarios such as image processing where kernels (i.e. matrices) are often small and have few outliers, the additional overhead of post processing in this way is relatively low. Therefore, providing architectural support to mitigate the impact of outliers as described above may enhance the suitability of resistive memory arrays in applications such as deep learning accelerators.

Figure 7:
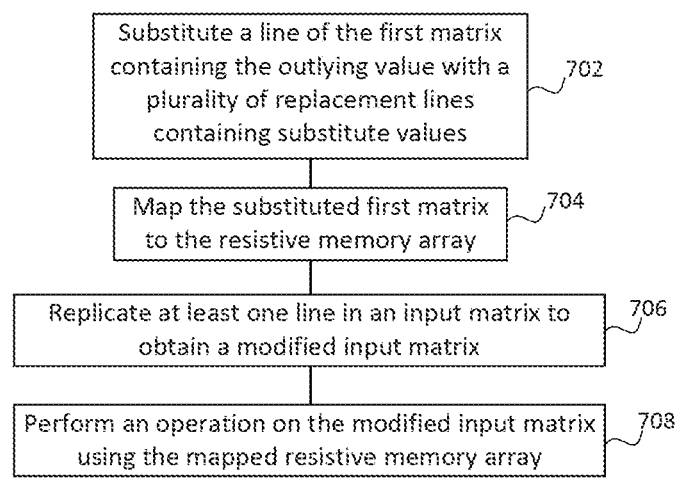
FIG. 7 is a flow chart showing an example method of performing a matrix operation.

Turning now to FIGS. 6 and 7, in another example, the substitution of block 106 may comprise substituting a line of the first matrix containing the outlying value with a plurality of replacement lines containing substitute values (block 702). The substituted first matrix may be mapped to the resistive memory array (block 704). As used herein, a line may be a column or a row of a matrix, or in the case that a matrix comprises a single column or row, a line may represent an element in the single column/row. In some examples, the line may be a line which is intended to be mapped to a column (or bit-line) or a row (word line) in a resistive memory array (mapping of columns of the matrix to columns or rows of the resistive memory array is discussed in more detail below). Considering the matrix A in FIG. 6a and the substituted matrix A" in FIG. 6b, the column comprising the outlying value "8" in matrix A (shown within a dotted line box for clarity) has been replaced by three new columns in matrix A" (also within a dotted line box). In this way, the large, outlying value has been broken down into three parts (i.e. elements A[1][1]: A[3][1]), so that each new column handles part of the larger value.

More generally, in some examples, the outlying value is distributed between the substitute values in the plurality of replacement lines. In some examples, a summation of the substitute values in the plurality of replacement lines is equal to the outlying value. In further examples, the substitute values in the plurality of replacement lines can be a represented by a memory element having a smaller bit depth than the outlying value. In some examples, the outlying value is split into two or more substitute values to reduce the range of the values in the matrix so that the bit depth to represent the matrix on a resistive memory array is reduced.

In some examples, non-outlying values from the substituted column, (e.g. the "−1" values at A[1][0] and A[1][2] in FIG. 6a), remain in their respective positions relative to left most column in matrix A". Other elements in the new columns that are not in the same row as the outlying value are set to 0 (e.g. A"[2][0], A"[3][0], A[2][2] and A"[3][2] in the example in FIG. 6b). In some examples, the non-outlying values from the substituted column, (e.g. the "−1" values at A[1][0] and A[1][2] in FIG. 6a) may be shifted, for example in this case to columns further to the right. In examples where the non-outlying values are shifted, then the correspond ng element in an input matrix may also be adjusted.

With this modification, the range of values in A" (and thus the number of element levels to map the matrix to the resistive memory array) is now 5 (i.e. −1, 0, 1, 2 and 3) and so 3-bit elements are sufficient to handle the matrix A" instead of the 4-bit elements to handle matrix A.

In a further iteration of this process, the values "3", "3" and "2" in A" may be identified as outliers and replaced with substitute values with a lower bit depth still, for example, as shown in the substitute matrix A''' in FIG. 6c. The range of the values in A''' is 3 and therefore 2-bit elements are sufficient to handle the matrix A'''. This substitution process may, in some examples, continue has far as is possible given the size and dimensions of the resistive memory array and thus the bit depth of the substituted matrix may be a trade-off between a larger matrix with a lower-bit depth and the number of resistive memory elements in the resistive memory array.

When A" is mapped to a resistive memory array, in some examples, columns 2, 3, and 4 will become rows 2, 3, and 4 of the resistive memory array. Whether the columns are mapped to columns or rows in the resistive memory array depends on the design of the array. As described above, mapped arrays can be used in matrix operations, for example, dot-product calculations. To calculate the dot-product of an input matrix (which in examples may be a one dimensional matrix, i.e. a vector) and a mapped matrix, in resistive memory array designs where the columns in the matrix are mapped to rows in the array, the input voltage gets multiplied with each cell conductance and the current is aggregated along the column. In examples of designs where matrix rows are mapped as arrays rows, then to calculate a dot product, the input matrix may be fed through the columns instead of rows and the results collected along rows instead of columns.

For example, consider multiplying an input matrix, in this example, an input vector. V=[2, 3, 4], with matrix A. According to an example, the matrix A is first substituted to form substituted matrix A" as described above. At least one line in the input matrix is then replicated to obtain a modified input matrix (in this example, a modified input vector) V' (block 706). This is to compensate for the additional columns of matrix A" (or A'''). For each additional column substituted into A, an additional column is also added to V, which duplicates the original value. For example, to multiply V with A". V is substituted to become V'=[2, 3, 3, 3, 4] to account for the additional columns that have been substituted into A to form A". The operation is then performed on the modified input vector, using the mapped resistive memory array (block 708). During the operation, the effective bitline current flowing through bitline-2 will be $\Sigma_{i=0}^{2} V[1]A'[row2][1]$, which is same as the product of V*A. As described above, in some examples, the second row of the matrix is mapped to the second column of the resistive memory array.

In some examples, which may be used in conjunction with the method of FIG. 7, identifying an outlying value comprises determining if a number of word lines in the resistive memory array to which the matrix is to be mapped is greater than the number of lines in the matrix to be mapped to the word lines. If such there are more word lines than matrix lines to be mapped thereto, the outlying value may be distributed across several word lines and what would otherwise be "spare" rows in the resistive memory array can be used to reduce the computational overhead associated with outlying values.

Figure 8:
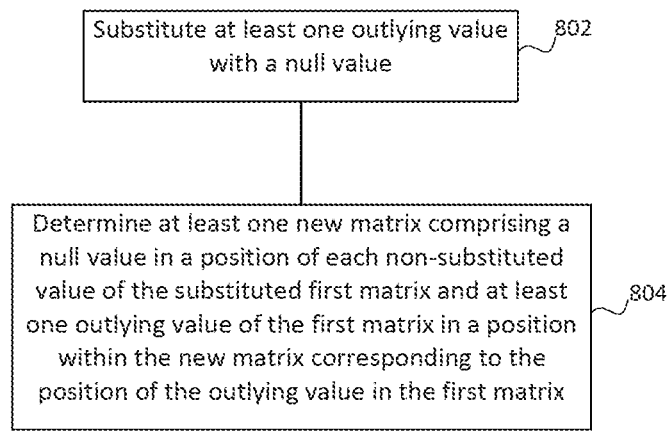
FIG. 8 is a flow chart showing another example method of performing a matrix operation.

Turning now to FIG. 8, in a further example, substituting at least one value (for example, as described in relation to block 106 of FIG. 1) comprises substituting at least one outlying value with a null value (block 802) (i.e. "0") and determining at least one new matrix comprising a null value in a position of each non-substituted value of the substituted first matrix and at least one outlying value of the first matrix in a position within the new matrix corresponding to the position of the outlying value in the first matrix (block 804).

This is illustrated in FIG. 9a which shows a matrix A, wherein, according to the definitions provided above, the value "8" is an outlying value. In this example, block 804 may comprise forming a substituted first matrix A' as shown in FIG. 9b, where the outlying matrix values are substituted with null values. A new matrix, A1, is then formed, comprising the outlying values at the same positions in the new matrix A1 as they were in the first matrix A.

In this example, the new matrix A1 and the substituted first matrix A' may then each be mapped to separate resistive memory arrays for multiplication with an input matrix.

It may be noted that, compared to the matrix A, the matrix A1 has a larger range. However, the matrix A1 may be scaled as part of the mapping process.

In the example of FIG. 9, the matrix A1 can be written as [0 0 1; 0 0 0; 1 0 1]*[8]. In other words, the matrix A1 can be scaled by dividing all the elements by 8, and an array controlled to represent the scaled matrix. This can then be accounted for by multiplying an output by the scaling factor (in this example, by multiplying the output by 8).

Thus in some examples, a method may comprise determining a substituted or new matrix (for example, A1) in which some values are substituted by null values, and applying a scaling factor, for example as part of a process of mapping the values of the matrix to an array. This may allow the substituted matrix to be represented with an array having a reduced bit depth compared to the bit depth called for by the original matrix (in this example, matrix A), and/or by the unscaled substituted matrix (in this example, A1). The scaling factor may be chosen to reduce, or, in some examples, minimise the bit depth called for by the matrix. The matrix may further comprise multiplying the output of such an array by the scaling factor.

The outputs of two operations using arrays having A1 and A' mapped thereto may then be combined to produce the final output.

In a further example, the process outlined above may be iterated on the new matrix A', such that the outliers in the matrix A' (i.e. the value "4") are substituted with a null value and effectively moved into a second new matrix A2. This is shown in FIG. 9c, where the matrix A2 represents the second new matrix, and the doubly substituted first matrix is represented by the matrix A".

In this example, the matrixes A1, A2 and A" may each be mapped to a resistive memory array (which may, as described above, comprise using a scaling factor). An operation such as a dot product may be performed on an input matrix using the three mapped arrays by performing the operation on each of the arrays individually and then combining the outputs (which may be scaled outputs if scaling was used in the mapping).

In some examples, the substituted outlying values correspond to values within a first range. For example, a value may be classed as an outlier if it falls within the upper quartile of values in the first matrix, or, for example, the highest third of the values. It should be understood that the percentiles provided herein are merely examples and any percentile ranges may be chosen. In another example, the values in the first matrix may be split into more than one range, for example, the matrices may be split into ranges corresponding to high, medium and low values in the matrix. For example, referring the FIG. 9, the original matrix A may be directly split into three matrices A1, A2, A", for example based on a range of values.

Figure 10:
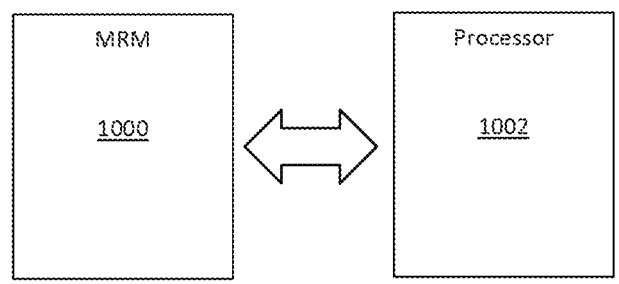
FIG. 10 is a schematic example of a machine readable medium associated with a processor.

FIG. 10 shows a machine readable medium 1000 in association with a processor 1002. The machine readable medium 1000 stores instructions which, when executed by the processor 1002, cause the processor 1002 to identify an outlying value in a received first matrix which is to be mapped to a resistive memory array, wherein each value in the matrix is to be represented as a resistance of a resistive memory element, and to substitute at least one value of a portion of the first matrix containing the outlying value with at least one substitute value to form a substituted first matrix.

In some examples, the instructions may cause the processor 1002 to implement any block, or any combination of the blocks of, FIG. 1, 4, 5, 7 or 8.

Figure 11:
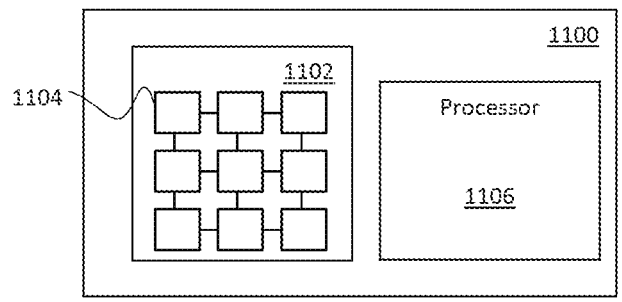
FIG. 11 is a schematic example of a processing apparatus.

FIG. 11 shows an example of a processing apparatus 1100 comprising an array 1102 of resistive memory elements 1104 (only one of which is labelled to avoid obscuring the Figure) and a controller 1106. The controller 1106 is to receive a first matrix of values to be mapped to the resistive memory array 1102, identify an outlying value in the first matrix, to substitute at least one value of a portion of the first matrix containing the outlying value with at least one substitute value to form a substituted first matrix, and to assign the substituted first matrix to the array 1102 of resistive memory elements 1104. In some examples, the controller may comprise one or more processors.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams (for example, the processor 1002). In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage (for example, the machine readable memory 1000) that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
receiving, by at least one processor, a first matrix of values to be mapped to a resistive memory array, wherein each value in the first matrix is to be represented as a resistance of a resistive memory element;
identifying, by at least one processor, an outlying value in the first matrix, wherein the outlying value, if removed from the first matrix, would reduce a bit depth of the first matrix; and
substituting, by at least one processor, at least one value of a portion of the first matrix containing the outlying value with at least one substitute value to form a substituted first matrix.

2. The method of claim 1 comprising:
mapping the substituted first matrix to the resistive memory array.

3. The method of claim 1 wherein substituting at least one value comprises substituting the outlying value for a non-outlying value, wherein the substituted first matrix can be represented by a resistive memory array of resistive memory elements having a bit depth which is smaller than the bit depth of the first matrix, wherein the bit depth of the first matrix is a bit depth of resistive memory elements of a resistive memory array to represent the first matrix.

4. The method of claim 3 wherein the method comprises:
mapping the substituted first matrix to the resistive memory array;
storing the outlying value;
performing an operation on an input matrix using the resistive memory array to obtain an output; and
post-processing the output to compensate for the substitution of the outlying value with the non-outlying value using the stored outlying value.

5. The method of claim 1 wherein substituting at least one value comprises substituting a line of the first matrix containing the outlying value with a plurality of replacement lines containing substitute values.

6. The method of claim 5 wherein the outlying value is distributed between the substitute values in the plurality of replacement lines.

7. The method of claim 5 wherein a summation of the substitute values in the plurality of replacement lines is equal to the values of the substituted line.

8. The method of claim 5 wherein each of the substitute values in the plurality of replacement lines can be a represented by a memory element that would result in a smaller bit depth than the outlying value.

9. The method of claim 5 further comprising:
mapping the substituted first matrix to the resistive memory array;
receiving an input matrix that is to be used in a matrix operation with the substituted first matrix;
replicating at least one line in the input matrix to obtain a modified input matrix; and
performing an operation on the modified input matrix using the resistive memory array having the substituted first matrix mapped thereto.

10. The method of claim 1 wherein identifying an outlying value comprises:
calculating the bit depth of the first matrix, wherein the bit depth represents a range of the values in the first matrix; and
determining a value is an outlying value if the bit depth to represent the range of the values is greater than a number of bits to represent the range of other values in the matrix.

11. The method of claim 1 wherein identifying an outlying value comprises:
calculating the bit depth of the first matrix, wherein the bit depth represents a range of the values in the first matrix; and
determining a value is an outlying value if the bit depth to represent the range of the values is reduced if the value is removed.

12. The method of claim 1 wherein substituting at least one value comprises substituting at least one outlying value with a null value, the method further comprising determining at least one new matrix comprising a null value in a position of each non-substituted value of the substituted first matrix and at least one outlying value of the first matrix in a position within the new matrix corresponding to the position of the outlying value in the first matrix.

13. The method of claim 1 wherein identifying an outlying value comprises determining if a number of word lines in the resistive memory array to which the matrix is to be mapped is greater than a number of lines in the matrix to be mapped to the word lines.

14. Processing apparatus comprising:
an array of resistive memory elements; and
a controller to receive a first matrix of values to be mapped to the array of resistive memory elements, identify an outlying value in the first matrix, wherein the outlying value, if removed from the first matrix, would reduce a bit depth of the first matrix, substitute at least one value of a portion of the first matrix containing the outlying value with at least one substitute value to form a substituted first matrix, and assign the substituted first matrix to the array of resistive memory elements.

15. A non-transitory machine readable medium comprising instructions which, when executed by a processor, cause the processor to:
identify an outlying value in a first matrix, wherein the outlying value, if removed from the first matrix, would reduce a bit depth of the first matrix, and wherein the first matrix is to be mapped to a resistive memory array and each value in the matrix is to be represented as a resistance of a resistive memory element; and substitute at least one value of a portion of the first matrix containing the outlying value with at least one substitute value to form a substituted first matrix.

* * * * *